United States Patent
Lee et al.

(10) Patent No.: US 9,674,951 B2
(45) Date of Patent: Jun. 6, 2017

(54) METHOD OF FORMING FINE ELECTRODE FOR FLAT PANEL DISPLAY

(71) Applicant: Samsung Display Co., Ltd., Yongin-si (KR)

(72) Inventors: Hyun Sup Lee, Hwaseong-si (KR); Jung-Hun Noh, Yongin-si (KR); Keun Kyu Song, Seoul (KR); Sang-Hee Jang, Bucheon-si (KR); Byung Seok Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/096,927

(22) Filed: Apr. 12, 2016

(65) Prior Publication Data

US 2016/0323999 A1 Nov. 3, 2016

(30) Foreign Application Priority Data

Apr. 30, 2015 (KR) .................. 10-2015-0062069

(51) Int. Cl.
| | | |
|---|---|---|
| *H05K 1/00* | (2006.01) | |
| *H05K 1/09* | (2006.01) | |
| *H05K 3/12* | (2006.01) | |
| *H05K 3/28* | (2006.01) | |

(52) U.S. Cl.
CPC ............. *H05K 1/09* (2013.01); *H05K 3/12* (2013.01); *H05K 3/1208* (2013.01); *H05K 3/28* (2013.01); *H05K 2201/10128* (2013.01); *H05K 2203/0562* (2013.01)

(58) Field of Classification Search
CPC ........... G02F 1/13; G02F 1/1343; H05K 1/09; H05K 3/12; H05K 3/28; H05K 3/1208; H01L 21/84

USPC ............. 174/253; 427/66, 458, 558; 430/7; 438/151, 164, 478, 597
See application file for complete search history.

(56) References Cited

U.S. PATENT DOCUMENTS

| | | | | |
|---|---|---|---|---|
| 4,878,102 | A | * 10/1989 | Bakker | ................. H01L 27/148 257/215 |
| 5,631,753 | A | * 5/1997 | Hamaguchi | ....... G02F 1/133512 257/E31.122 |
| 6,413,845 | B1 | * 7/2002 | Izumi | ................. H01L 29/4908 257/E21.582 |
| 9,064,778 | B2 | 6/2015 | Lim et al. | |

(Continued)

FOREIGN PATENT DOCUMENTS

| | | |
|---|---|---|
| KR | 10-2009-0000525 | 1/2009 |
| KR | 101424603 | 8/2014 |

OTHER PUBLICATIONS

Zhang et al., "Inkjet Printing High-Resolution, Large-Area Graphene Patterns by Coffee-Ring Lithography", Advanced Materials, 2012, p. 436-440, vol. 24.

*Primary Examiner* — Xiaoliang Chen
(74) *Attorney, Agent, or Firm* — H.C. Park & Associates, PLC

(57) ABSTRACT

A method of forming a fine electrode, including: forming a base part on a substrate; disposing a transparent electrode solution at a boundary portion between a circumferential surface of the base part and an upper surface of the substrate; forming a transparent electrode by partially removing the transparent electrode solution; and removing the base part from the substrate.

8 Claims, 6 Drawing Sheets

(56) References Cited

U.S. PATENT DOCUMENTS

| | | | |
|---|---|---|---|
| 2003/0129321 A1* | 7/2003 | Aoki | G02B 5/201 |
| | | | 427/458 |
| 2003/0132443 A1* | 7/2003 | Kim | G02F 1/13458 |
| | | | 257/79 |
| 2003/0203458 A1* | 10/2003 | Kozaki | C09B 67/0013 |
| | | | 435/135 |
| 2004/0052977 A1* | 3/2004 | Ogawa | G02B 5/3016 |
| | | | 428/1.1 |
| 2004/0227864 A1* | 11/2004 | Kim | G02F 1/13458 |
| | | | 349/43 |
| 2005/0147766 A1* | 7/2005 | Aoki | G02B 5/201 |
| | | | 427/532 |
| 2006/0040435 A1* | 2/2006 | Morisue | H01L 27/1292 |
| | | | 438/151 |
| 2006/0263705 A1* | 11/2006 | Kim | G02F 1/133516 |
| | | | 430/7 |
| 2008/0297711 A1* | 12/2008 | Kawasaki | G02F 1/13458 |
| | | | 349/139 |
| 2009/0181172 A1 | 7/2009 | Parpia et al. | |

* cited by examiner

US 9,674,951 B2

METHOD OF FORMING FINE ELECTRODE FOR FLAT PANEL DISPLAY

CROSS-REFERENCE TO RELATED APPLICATION

This application claims priority from and the benefit of Korean Patent Application No. 10-2015-0062069, filed on Apr. 30, 2015, which is hereby incorporated by reference for all purposes as if fully set forth herein.

BACKGROUND

Field

Exemplary embodiments relate a method of forming a fine electrode for flat panel display.

Discussion of the Background

Electrode patterns may be disposed on a substrate for a display, a semiconductor device, or the like, and, as display devices develop, the sizes of these electrode patterns have been reduced. One of the reasons is as follows: a storage node (SN) of a cell capacitor of a DRAM memory device is formed so that an opening hole penetrating through a mold layer, which is a sacrificial layer, is formed, and the shape thereof is formed by the formed hole. Therefore, in order to form the capacitor in a limited narrow area, the size of the storage node needs to be more finely implemented.

Further, performance of a thin film transistor (TFT) may be indicated by a cut-off frequency. Also, the narrower a channel space of a transistor channel, the higher the cut-off frequency, such that the TFT has better performance.

Further, as a method of forming a pattern on a substrate, photolithography methods are generally used. When photolithography is used, the widths of the patterns may be determined by the resolution of the exposure equipment used in the process. However, it may be difficult to directly transfer the image of a hole shape to a photoresist due to the resolution limit of the exposure equipment.

The above information disclosed in this Background section is only for enhancement of understanding of the background of the inventive concept, and, therefore, it may contain information that does not form the prior art that is already known to a person of ordinary skill in the art.

SUMMARY

Exemplary embodiments provide a method of forming a fine electrode for flat panel display.

Exemplary embodiments provide a method of forming a fine electrode for flat panel display having an advantage of finely forming an electrode through a simple and cheap process and/or an advantage of finely forming an electrode without considering the resolution of the exposure equipment.

Additional aspects will be set forth in the detailed description which follows, and, in part, will be apparent from the disclosure, or may be learned by practice of the inventive concept.

An exemplary embodiment discloses a method of forming a fine electrode for flat panel display, including: forming a base part on a substrate; disposing a transparent electrode solution at a boundary portion between a circumferential surface of the base part and an upper surface of the substrate; forming a transparent electrode by partially removing the transparent electrode solution; and removing the base part from the substrate.

An exemplary embodiment also discloses a method of forming a fine electrode for flat panel display, including: forming a base part on a first portion of an upper surface of a substrate; disposing a transparent electrode solution at a boundary portion between a side surface of the base part and the upper surface of the substrate; forming a transparent electrode by partially removing the transparent electrode solution; and removing the base part from the substrate.

An exemplary embodiment further discloses an electrode patterned substrate for flat panel display, including: a substrate; and a transparent electrode pattern disposed on an upper surface of the substrate. The transparent electrode pattern has a shape corresponding to a partial residue of a transparent electrode solution disposed at a boundary portion between a side surface of a removed base part and the upper surface of the substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
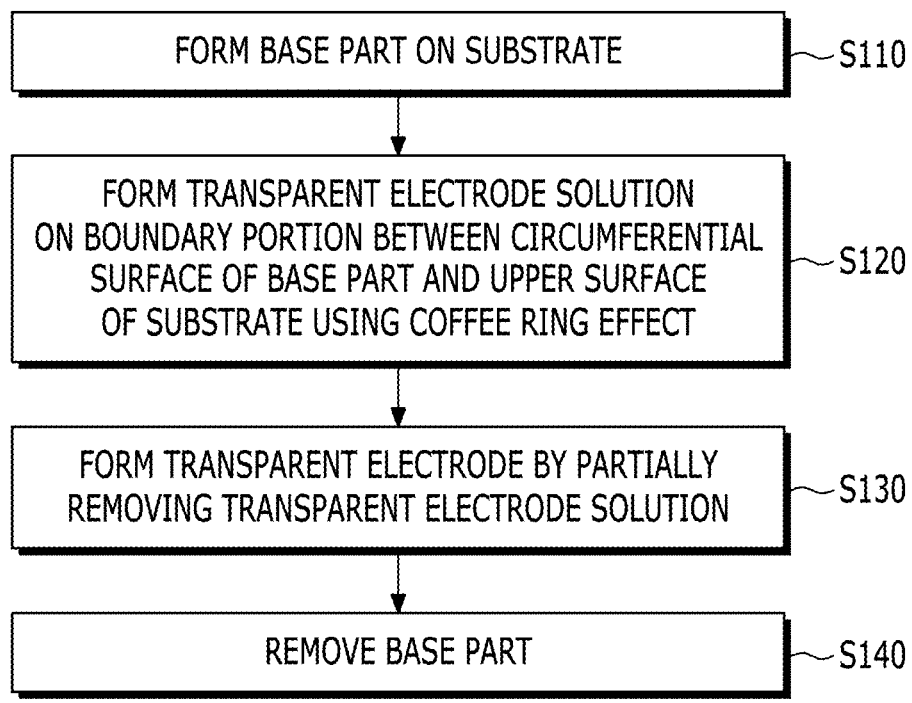
FIG. 1 is a flowchart sequentially illustrating a method of forming a fine electrode for flat panel display according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Exemplary embodiments are described herein with reference to sectional illustrations that are schematic illustrations of an idealized exemplary embodiment. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a flowchart sequentially illustrating a method of forming a fine electrode for flat panel display according to an exemplary embodiment.

Referring to FIG. 1, the method of forming a fine electrode for flat panel display according to an exemplary embodiment may include forming a base part by disposing the base part on a portion of the top surface of a substrate (S110), disposing a transparent electrode solution at a boundary portion between a side surface, e.g., a circumferential surface, of the base part and an upper surface of the substrate using a coffee ring effect (S120), forming a transparent electrode by partially removing the transparent electrode solution (S130); and removing the base part from the substrate (S140).

Hereinafter, each of the processes of the method of forming a fine electrode for flat panel display according to an exemplary embodiment will be described in more detail with reference to the accompanying drawings.

Figure 2:
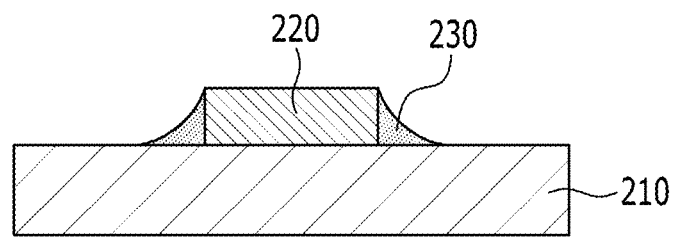
FIG. 2 is a view illustrating a state in which a base part is formed on a substrate, and a transparent electrode solution is formed at a boundary portion between a circumferential surface of the base part and an upper surface of the substrate using a coffee ring effect in the method of forming a fine electrode for flat panel display of FIG. 1 according to an exemplary embodiment.

FIG. 2 is a view illustrating a state in which a base part is formed on a substrate, and a transparent electrode solution is disposed at a boundary portion between a circumferential surface of the base part and an upper surface of the substrate using a coffee ring effect in the method of forming a fine electrode for flat panel display of FIG. 1 according to an exemplary embodiment.

Referring to FIG. 2, in the forming of the base part on the substrate (S110, see FIG. 1), although not illustrated in detail, any method may be used as long as the method is a method of forming a specific member on a substrate 210. For example, as a method of forming a base part 220 on the substrate 210, a photo etching method may be used. To this end, the base part 220 may be, for example, a photoresist layer. A photoresist (PR) is a polymer material of which resistance against chemical is changed by being exposed to light.

The plan view of the base part 220 may have a pattern in consideration of an intended pattern shape for the transparent electrodes 240. Further, the transparent electrode solution 230 may be disposed along a partial portion of the circumferential surface of the base part 220 or certain side surfaces among multiple side surfaces of the base part 220.

However, the method of forming the base part 220 on the substrate is not limited to the photo etching method, but various methods may be used.

Meanwhile, a pitch between transparent electrodes 240 may be set depending on the width of the base part 220. For example, when the width of the base part 220 increases, the pitch between the transparent electrodes 240 may also increase. On the contrary, if the width of the base part 220 decreases, the pitch between the transparent electrodes 240 may also decrease.

In the forming of the transparent electrode solution at the boundary portion between the circumferential surface of the base part 220 and the upper surface of the substrate 210 using the coffee ring effect (S120, see FIG. 1), the transparent electrode solution 230 is discharged and dried at the boundary portion between the circumferential surface of the base part 220 and the upper surface of the substrate 210.

Here, the transparent electrode solution may be, for example, an aqueous solution containing graphene, but is not limited thereto. As the drying of the transparent electrode solution 230, a natural drying method in the air, or a drying method in drying equipment may be used.

The solute of the transparent electrode solution 230 may be accumulated at the boundary portion between the circumferential surface of the base part 220 and the upper surface of the substrate 210 by the coffee ring effect.

The coffee ring effect will be described in more detail. A "coffee ring" of the coffee ring effect refers to a pattern left by a puddle of particle-laden liquid after the liquid evaporates. The phenomenon leaves a ring-shaped deposit along the perimeter of a spill of coffee. It has been suggested that the pattern is due to capillary flow induced by different evaporation rates across the drop. More specifically, liquid evaporating from the edge of the drop is replenished by liquid from the interior of the drop. The flow toward the edge can carry significant amount of the dispersed material to the edge.

Liquid is dried from the outer surface or an edge of a discharged liquid. A portion of the discharged liquid positioned at the middle flows toward the edge thereof by capillary flow. In more detail, liquid tends to maintain a spherical shape due to surface tension. When an edge portion is evaporated first in the discharged liquid, while the portion of the liquid at the middle flows toward the edge, the liquid tends to maintain a shape as close to the original shape as possible.

For example, in the case of discharging liquid having a predetermined color to a specific target, a solute in the liquid is accumulated at an edge. In addition, as the liquid is continuously evaporated, the solute is continuously accumulated. Therefore, when the discharged liquid is completely dried, the edge has a dark color as compared to the central portion.

Figure 3:
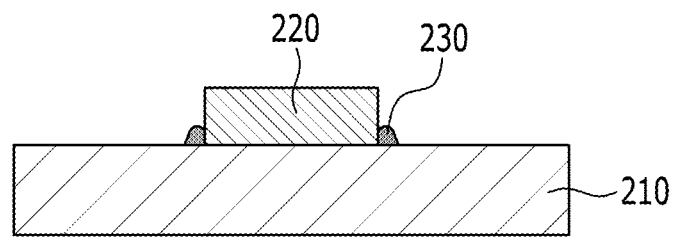
FIG. 3 is a view illustrating a state in which a transparent electrode is formed by partially removing the transparent electrode solution in the method of forming a fine electrode for flat panel display of FIG. 1 according to an exemplary embodiment.

FIG. 3 is a view illustrating a state in which a transparent electrode is formed by partially removing the transparent electrode solution in the method of forming a fine electrode for flat panel display of FIG. 1 according to an exemplary embodiment.

Referring to FIG. 3, in the forming of the transparent electrode by partially removing the transparent electrode solution (S130, see FIG. 1), a large amount of a solute contained in the transparent electrode solution may remain at the boundary portion between the circumferential surface of the base part 220 and the upper surface of the substrate 210 by the above-mentioned coffee ring effect. When the transparent electrode solution 230 as described above is finally dried, only the solute remains.

As a method of partially removing the dried transparent electrode solution 230, a solvent may be used to partially remove the dried transparent electrode solution 230, but aspects are not limited thereto.

Figure 4:
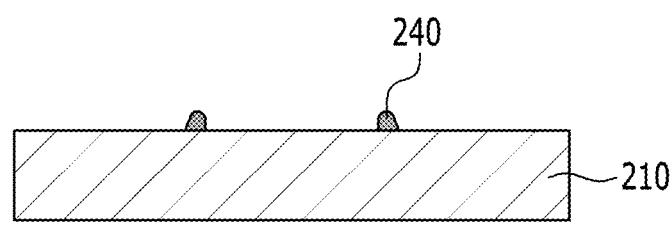
FIG. 4 is a view illustrating a state in which the base part is removed in the method of forming a fine electrode for flat panel display of FIG. 1 according to an exemplary embodiment.

FIG. 4 is a view illustrating a state in which the base part is removed in the method of forming a fine electrode for flat panel display of FIG. 1 according to an exemplary embodiment.

Referring to FIG. 4, with respect to the removal of the base part (S140, see FIG. 1), when the base part 220 positioned on the substrate 210 (see FIG. 3) is finally removed, only the transparent electrode 240 may remain on the substrate 210. The width of the transparent electrode 240 formed on the substrate 210 may be controlled by the following method.

Figure 5:
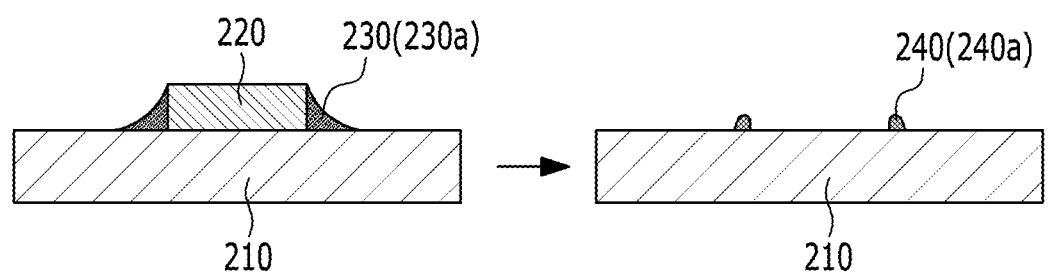
FIG. 5 and FIG. 6 are views illustrating that as the concentration of the transparent electrode solution decreases, the transparent electrode is formed to have a fine width according to an exemplary embodiment.
Figure 6:
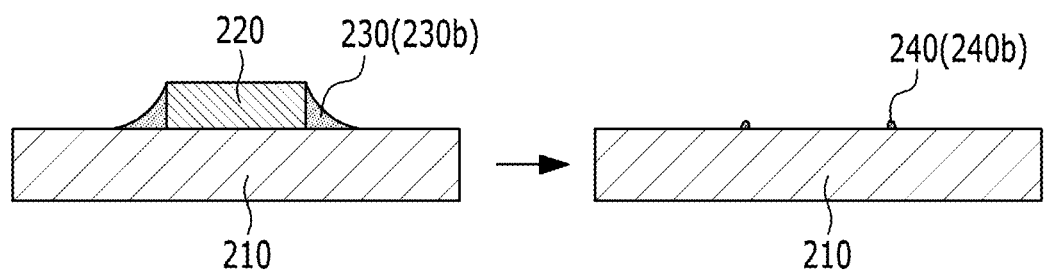

FIG. 5 and FIG. 6 are views illustrating that as the concentration of the transparent electrode solution decreases, the transparent electrode is formed to have fine width. Here, the concentration of a transparent electrode solution 230a illustrated in FIG. 5 is higher than the concentration of a transparent electrode solution 230b illustrated in FIG. 6.

As the concentration of the transparent electrode solution 230 used in order to form the transparent electrode 240 decreases, the width of the transparent electrode 240 also decreases.

As illustrated in FIG. 5, in the case of forming a fine electrode for flat panel display pattern using the transparent electrode solution 230a having a relatively high concentration, if the transparent electrode solution 230a is partially removed and then the base part 220 is removed, a transparent electrode 240a may be formed on the substrate 210 so as to have a relatively wide width in comparison with the transparent electrode 240b in FIG. 6.

Referring to FIG. 6, in the case of forming a fine electrode pattern for flat panel display using a transparent electrode solution 230b having a relatively low concentration, if the transparent electrode solution 230b is partially removed and then the base part 220 is removed, a transparent electrode 240b may be formed on the substrate 210 so as to have a relatively narrow width in comparison with the transparent electrode 240a.

As described above with respect to FIG. 5 and FIG. 6, the lower the concentration of the transparent electrode solution 230, the narrower the width of the formed transparent electrode 240. Therefore, the width of the transparent electrode 240 may be implemented in accordance with a design requirement by changing the concentration of the transparent electrode solution 230 depending on the design requirement.

Further, as shown in FIG. 2, the shape of the transparent electrode solution 230 disposed at the boundary portion between the circumferential surface of the base part 220 (or a side surface of the base part 220) and the upper surface of the substrate 210 is formed according to the coffee ring effect. As shown in FIG. 3 and FIG. 4, the transparent electrode solution 230 may be partially removed and the transparent electrodes 240 may be formed. The partial removal of the transparent electrode solution 230 may involve the removal of solvent from the transparent electrode solution 230, and the remaining portion of the transparent electrode solution 230 may include solute formed by removing the solvent of the transparent electrode solution 230.

As shown in FIG. 4, an electrode patterned substrate for flat panel display including the substrate 210 and the transparent electrodes 240 may have fine electrodes. The transparent electrode 240 may have a shape corresponding to a partial residue of the transparent electrode solution 230 disposed at the boundary portion between a side surface of a removed base part 220 and the upper surface of the substrate 210. Accordingly, the transparent electrodes 240 may include a shape corresponding to the side surface of the removed base part 220. The removed base part 220 may be removed from the substrate 210 after partially removing the transparent electrode solution 230. Further, the transparent electrodes 240 may include a shape corresponding to the side surface of the removed base part 220, which is slanted with respect to the upper surface of the substrate 210. Further, the transparent electrodes 240 may include a shape corresponding to the side surface of the removed base part 220, which is substantially perpendicular to the upper surface of the substrate 210.

Further, the transparent electrodes 240 may include a shape generated, according to a coffee ring effect, when the transparent electrode solution 230 was disposed at the boundary portion between the side surface of the removed base part 220 and the upper surface of the substrate 210.

Figure 7:
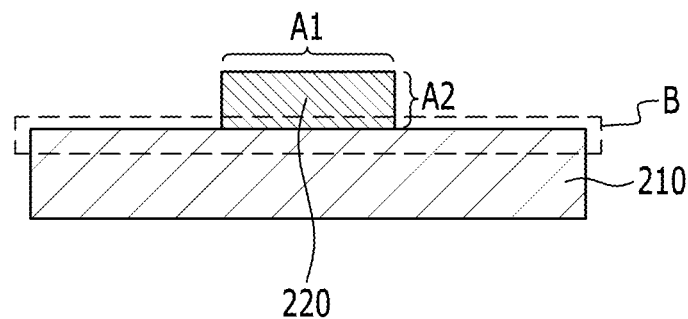
FIG. 7 is a view for illustrating that a surface-treatment is differently performed on each of the portions of the substrate and the base part in the method of forming a fine electrode for flat panel display of FIG. 1 according to an exemplary embodiment.

FIG. 7 is a view for illustrating that a surface-treatment is performed differently on each of the portions of the substrate and the base part in the method of forming a fine electrode for flat panel display of FIG. 1 according to an exemplary embodiment.

Before the forming of the transparent electrode solution at the boundary portion between the circumferential surface of the base part and the upper surface of the substrate using the coffee ring effect (S120, see FIG. 1), a surface-treating process for an upper surface B of the substrate 210 and an upper surface A1, and a circumferential surface A2 of the base part 220 may be performed.

More specifically, in the surface-treating of the upper surface B of the substrate and the upper surface A1, and the circumferential surface A2 of the base part 220, a surface-treatment performed on the upper surface B of the substrate 210 and the circumferential surface A2 of the base part 220 may be a hydrophilic coating, and a surface-treatment performed on the upper surface A1 of the base part 220 may be a hydrophobic coating.

The different coating for the upper surface A1 of the base part 220 may be performed for the purpose of preventing the transparent electrode solution 230 from being adhered to the upper surface A1 of the base part 220 and allow the transparent electrode solution 230 to be adhered only to the circumferential surface A2 of the base part 220 and the upper surface B of the substrate 210 during a process of discharging the transparent electrode solution 230 to the boundary portion between the circumferential surface A2 of the base 220 and the upper surface B of the substrate 210.

As a method of performing the hydrophobic coating only on the upper surface of the base part 220, a method of treating with fluorine gas using dry-etching equipment may be used. In this case, since the circumferential surface A2 of the base part 220 is not naturally exposed to the dry etching equipment while the upper surface A1 of the base part 220 is treated with the dry etching equipment, the circumferential surface A2 may not be treated with the fluorine gas.

Figure 8A:
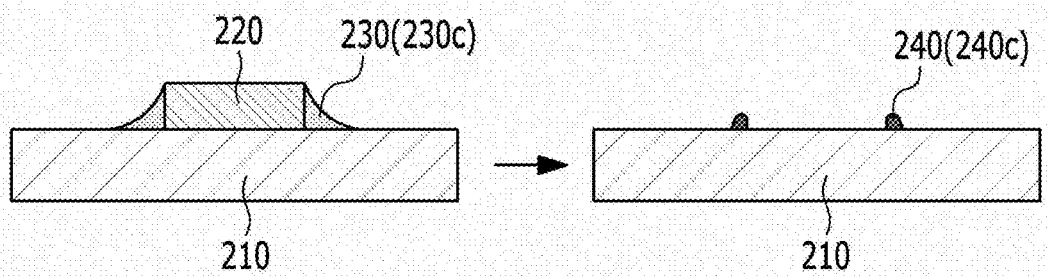
FIG. 8A and FIG. 8B are views illustrating a state in which a transparent electrode is formed by using a hydrophobic transparent electrode solution in the method of forming a fine electrode for flat panel display of FIG. 1 according to an exemplary embodiment.
Figure 8B:
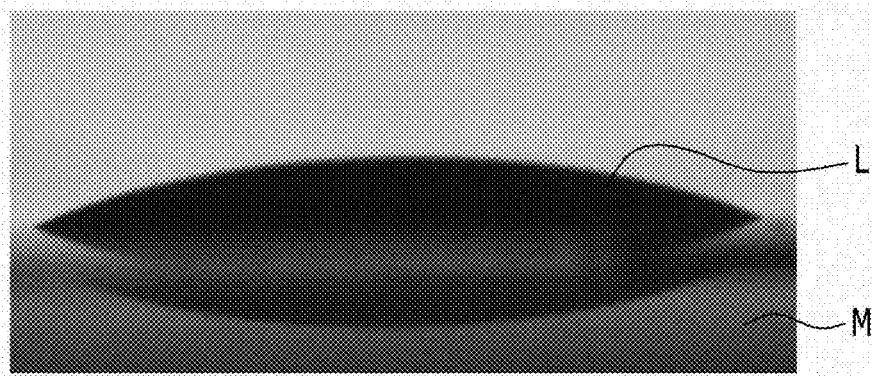
Figure 9A:
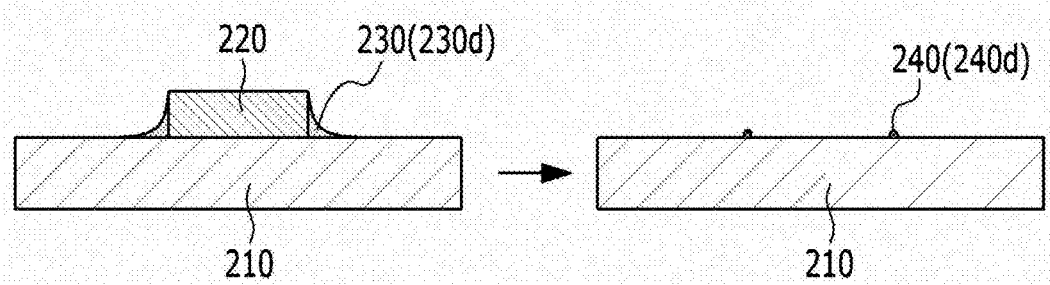
FIG. 9A and FIG. 9B are views illustrating a state in which a transparent electrode is formed by using a super-hydrophobic transparent electrode solution in the method of forming a fine electrode for flat panel display of FIG. 1 according to an exemplary embodiment.
Figure 9B:
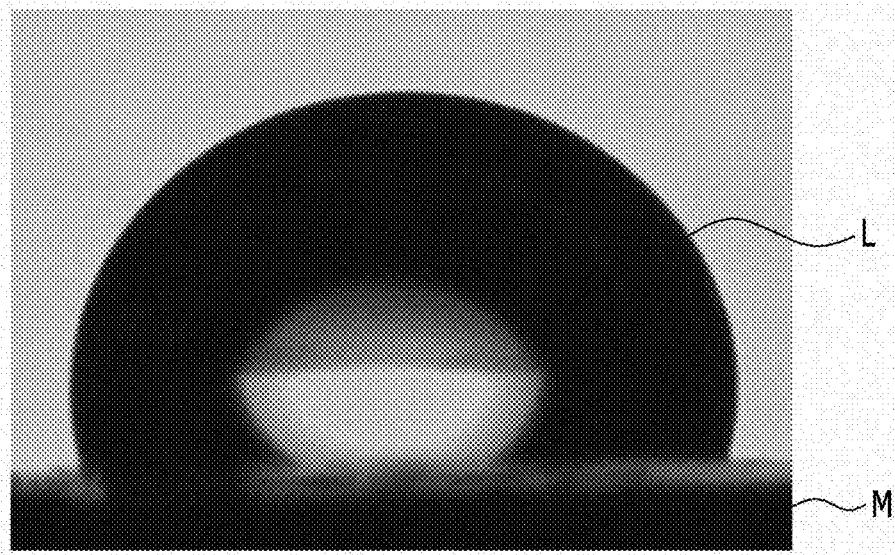

FIG. 8A and FIG. 8B are views illustrating a state in which a transparent electrode is formed by using a hydrophobic transparent electrode solution in the method of forming a fine electrode for flat panel display of FIG. 1 according to an exemplary embodiment. FIG. 9A and FIG. 9B are views illustrating a state in which a transparent electrode is formed by using a super-hydrophobic transparent electrode solution in the method of forming a fine electrode for flat panel display of FIG. 1 according to an exemplary embodiment.

Referring to FIG. 7, FIG. 8A, FIG. 8B, FIG. 9A, and FIG. 9B, in the surface-treating of the upper surface B of the substrate 210 and the upper surface A1 and the circumferential surface A2 of the base part 220, if the transparent electrode solution 230 is hydrophilic, the surface-treatment performed on the upper surface B of the substrate 210 and the circumferential surface A2 of the base part 220 may be hydrophobic coating. Also, the transparent electrode solution 230 is hydrophilic, similar to the liquid L formed on a base M illustrated in FIG. 8B.

As described above, in the case in which the transparent electrode solution 230 is not hydrophilic but hydrophobic or super-hydrophobic, only when hydrophilic surface-treatment is performed, the transparent electrode 240 may be stably formed.

However, in the case in which a transparent electrode solution 230d is hydrophilic, only when hydrophobic coating is performed on the upper surface B of the substrate 210 and the circumferential surface A2 of the base part 220 as in a liquid L formed on a base M illustrated in FIG. 9B, the transparent electrode 240d may be stably formed.

In addition, as illustrated in FIG. 9A, in the case of using the hydrophilic transparent electrode solution 230d and performing super-hydrophobic coating on the upper surface of the substrate 210 and the circumferential surface of the base part 220, a transparent electrode 240d having a narrower width than the width of the transparent electrode 240c illustrated in FIG. 8A may be implemented. According to an exemplary embodiment, the transparent electrode solution 230 (e.g., the transparent electrode solution 230c or 230d) may be hydrophilic or hydrophobic as described above.

As described above, according to an embodiment, in the method of forming a fine electrode for flat panel display as described above, the transparent electrode is formed due to the coffee ring effect. In addition, an exposure equipment is only used in a process of forming the base part 220, which does not have an influence on formation of a width of the electrode. Thus, the resolution of the exposure equipment is not a significant part in forming fine electrodes, and the fine electrodes may be formed without using a high-resolution exposure equipment.

In addition, in the method of forming a fine electrode for flat panel display according to an embodiment, the width of the transparent electrode 240 may be narrowly implemented in accordance with the design requirement only by adjusting the concentration of the transparent electrode solution 230 or surface-treating the substrate 210 and the base part 220.

Therefore, in the method for forming a fine electrode according to an exemplary embodiment, the width of the transparent electrode 240 may be narrowly implemented without using an exposure equipment having excellent resolution.

As described above, since expensive exposure equipment is not used to form the fine transparent electrode 240, manufacturing costs may be reduced. In addition, since a high-resolution exposure equipment is not used to form the transparent electrode 240, a process may be simplified.

In the method of forming a fine electrode according to an exemplary embodiment, the transparent electrode is formed due to the coffee ring effect. In addition, an exposure equipment is only used in a process of forming the base part, which does not have an influence on formation of a width of the electrode.

In the method of forming a fine electrode for flat panel display according to an exemplary embodiment, a width of the transparent electrode may be finely implemented in accordance with the design only by adjusting the concentration of the transparent electrode solution or surface-treating the substrate and the base part.

Therefore, in the method of forming a fine electrode for flat panel display according to an exemplary embodiment, the width of the transparent electrode may be finely implemented without using a high-resolution exposure equipment.

According to an exemplary embodiment, since expensive exposure equipment is not used to form the fine transparent electrode, manufacturing costs may decrease. In addition, since exposure equipment is not used to form the transparent electrode, a process may be simplified.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of forming a fine electrode for flat panel display, comprising:
   forming a base part on a substrate;
   disposing a transparent electrode solution at a boundary portion between a circumferential surface of the base part and an upper surface of the substrate;
   forming a transparent electrode by partially removing the transparent electrode solution; and
   removing the base part from the substrate.

2. The method of claim 1, further comprising:
   performing a surface-treatment on the upper surface of the substrate, an upper surface of the base part, and the circumferential surface of the base part.

3. The method of claim 2, wherein:
   the surface-treatment performed on the upper surface of the substrate and the circumferential surface of the base part is a hydrophilic coating, and
   the surface-treatment performed on the upper surface of the base part is a hydrophobic coating.

4. The method of claim 2, further comprising:
   selecting a concentration of the transparent electrode solution to control a width of the transparent electrode.

5. The method of claim 4, wherein:
   the width of the transparent electrode decreases as the concentration of the transparent electrode solution decreases.

6. The method of claim 2, wherein:
   when the transparent electrode solution is hydrophilic, the surface-treatment performed on the upper surface of the substrate and the circumferential surface of the base part is a hydrophobic coating.

7. The method of claim 1, wherein:
   the base part comprises a photoresist layer.

8. The method of claim 1, wherein a shape of the transparent electrode solution disposed at the boundary portion between the circumferential surface of the base part and the upper surface of the substrate is formed according to a coffee ring effect.

* * * * *